(12) United States Patent
Sayce et al.

(10) Patent No.: US 9,790,120 B2
(45) Date of Patent: Oct. 17, 2017

(54) METHOD FOR THE MANUFACTURE OF SYNTHETIC QUARTZ GLASS

(71) Applicant: Heraeus Quarzglas GmbH & Co. KG, Hanau (DE)

(72) Inventors: Ian George Sayce, Stocksfield (GB); Martin Trommer, Bitterfeld (DE)

(73) Assignee: Heraeus Quarzglas GmbH & Co. KG, Hanau (DE)

( * ) Notice: Subject to any disclaimer, the term of this patent is extended or adjusted under 35 U.S.C. 154(b) by 0 days.

(21) Appl. No.: 14/868,858

(22) Filed: Sep. 29, 2015

(65) Prior Publication Data

US 2016/0096765 A1 Apr. 7, 2016

(30) Foreign Application Priority Data

Oct. 1, 2014 (EP) ..................................... 14187320

(51) Int. Cl.
| | |
|---|---|
| *C03B 37/018* | (2006.01) |
| *C03B 20/00* | (2006.01) |
| *C03B 19/14* | (2006.01) |
| *C23C 16/44* | (2006.01) |
| *C03C 3/06* | (2006.01) |
| *C08G 77/04* | (2006.01) |

(52) U.S. Cl.
CPC .............. *C03B 20/00* (2013.01); *C03B 19/14* (2013.01); *C03B 19/1415* (2013.01); *C03C 3/06* (2013.01); *C08G 77/04* (2013.01); *C23C 16/4402* (2013.01); *C03B 2201/03* (2013.01); *C03B 2207/32* (2013.01)

(58) Field of Classification Search
CPC . C03B 37/018; C03B 37/01; C03B 37/01807; C03B 2207/32
See application file for complete search history.

(56) References Cited

U.S. PATENT DOCUMENTS

| | | | | |
|---|---|---|---|---|
| 5,879,649 | A | * 3/1999 | Henderson | ........... C03B 19/1415 423/336 |
| 2013/0133378 | A1 | * 5/2013 | Fabian | .............. C03B 37/01807 65/421 |
| 2016/0107923 | A1 | 4/2016 | Badeke et al. | |

FOREIGN PATENT DOCUMENTS

| | | |
|---|---|---|
| DE | 3016010 | 10/1981 |
| DE | 10359951 | 7/2004 |
| DE | 102013209673 | 5/2014 |
| EP | 0105328 | 9/1983 |
| EP | 0529189 | 3/1993 |
| EP | 0760373 | 3/1997 |
| EP | 0975690 | 10/1998 |
| EP | 1503957 | 9/2003 |
| GB | 2459943 | 11/2009 |
| WO | 99/15468 | 4/1999 |
| WO | 99/54259 | 10/1999 |
| WO | 2004049398 | 6/2004 |
| WO | 2013092553 | 6/2013 |

* cited by examiner

*Primary Examiner* — Noah Wiese
(74) *Attorney, Agent, or Firm* — Dicke, Billig & Czaja, PLLC

(57) ABSTRACT

One aspect relates to a method for the production of synthetic quartz glass. Moreover, one aspect relates to a polyalkylsiloxane compound, which includes certain specifications with respect to chlorine content, metallic impurities content, and residual moisture, as well as the use thereof for the production of synthetic quartz glass. One aspect also relates to a synthetic quartz glass that can be obtained according to the method of one embodiment.

20 Claims, 1 Drawing Sheet

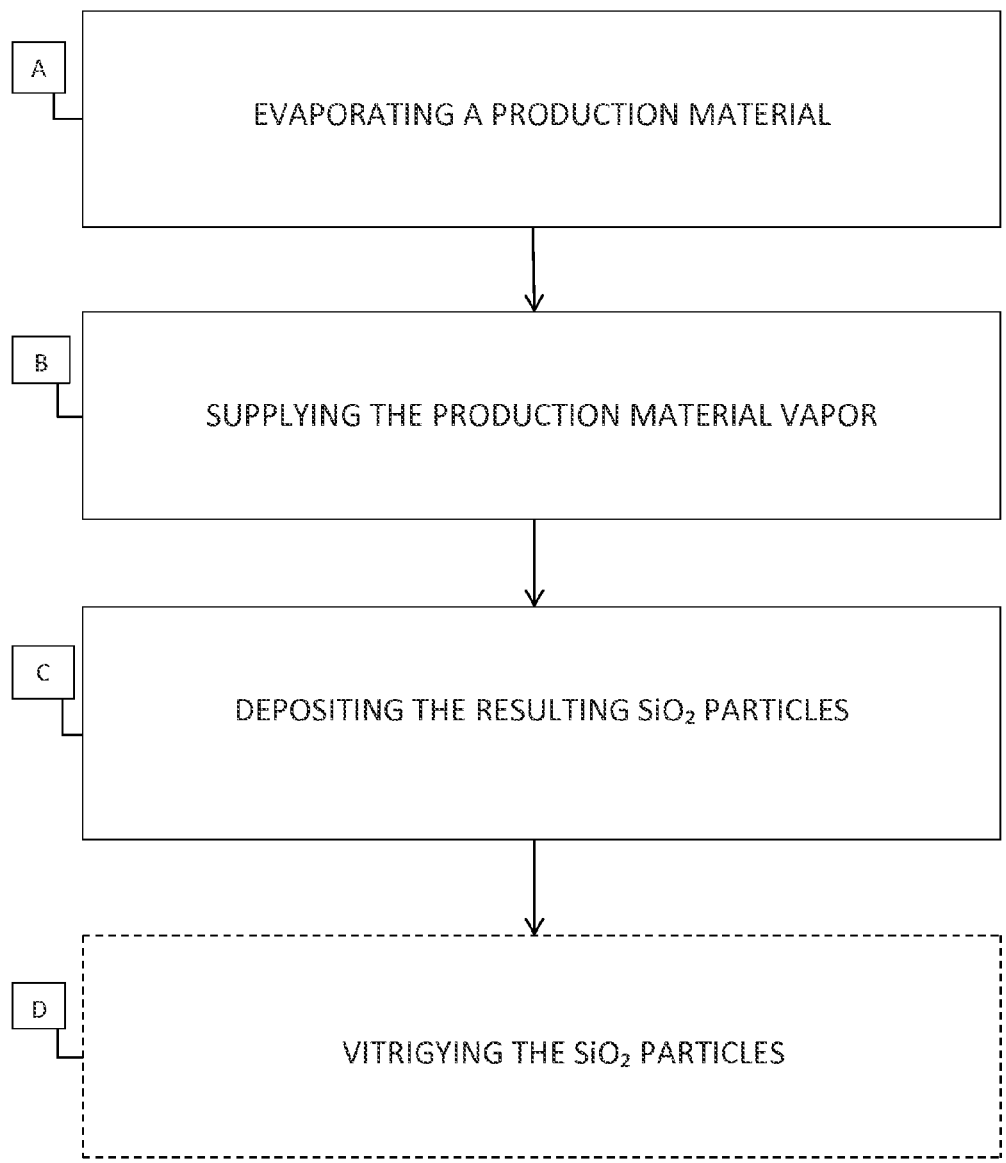

METHOD FOR THE MANUFACTURE OF SYNTHETIC QUARTZ GLASS

CROSS-REFERENCE TO RELATED APPLICATIONS

This Utility Patent Application claims priority to European Patent Application No. EP 14 187 320.8, filed on Oct. 1, 2014, which is incorporated herein by reference.

BACKGROUND

One embodiment relates to a method for the manufacture of synthetic quartz glass. One embodiment also relates to a polyalkylsiloxane compound, which includes certain specifications with respect to chlorine content, metallic impurities content, and residual moisture, as well as the use thereof for the production of synthetic quartz glass. A further aspect of one embodiment relates to a synthetic quartz glass that can be obtained according to the method according to one embodiment.

Referring to the production of synthetic quartz glass, it is customary to generate $SiO_2$ particles from a silicon-containing starting substance in a CVD procedure by means of hydrolysis or oxidation and to deposit these on a moving support. The method can be subdivided into external and internal deposition methods. In external deposition methods, the $SiO_2$ particles are applied onto the outside of a rotating support. Examples of pertinent external deposition methods include the so-called OBD method (Outside Vapor Phase Deposition), the VAD method (Vapor Phase Axial Deposition) or the PECVD method (Plasma Enhanced Chemical Vapor Deposition). The best-known example of an internal deposition method is the MCVD method (Modified Chemical Vapor Deposition), in which $SiO_2$ particles are deposited on the internal wall of a tube heated from outside.

If the temperature in the area of the support surface is sufficiently high, the $SiO_2$ particles vitrify directly, which is also known as "direct vitrification". In contrast, the temperature during the deposition of the $SiO_2$ particles in the so-called "soot method" is so low that a porous $SiO_2$ soot layer is obtained, which is then sintered into transparent quartz glass in a separate process step. Both the direct vitrification and the soot method lead to a dense, transparent, highly pure, synthetic quartz glass.

Silicon tetrachloride ($SiCl_4$), for example, is known from the prior art as a silicon-containing production material for the production of synthetic quartz glass. Silicon tetrachloride and other analogous chlorine-containing substances possess sufficient vapor pressures already at moderate temperatures below 100° C. such that any impurities usually remain in the liquid phase and the production of highly pure soot bodies is made easier.

One significant disadvantage of the chlorine-containing production materials is that the conversion thereof to synthetic quartz glass is associated with the production of hydrochloric acid, which causes high costs in the scrubbing of exhaust gas and the disposal. In the past, a large number of so-called chlorine-free organo-silicon compounds have been tried as starting materials for quartz glass production for this reason. Examples include monosilanes, alkoxysilanes, siloxanes, and silazanes. A particularly interesting group of the so-called chlorine-free organo-silicon compounds, the polyalkylsiloxanes (also called "siloxanes" for short), are known, for example, from DE 30 16 010 A1. Specifically the polycyclosiloxanes, which can be included in the polyalkylsiloxanes, are characterized by having a particularly high fraction of silicon per weight fraction, which contributes to the economic efficiency of their use in the production of synthetic quartz glass. Due to the availability of commercial quantities at high purity, octamethylcyclotetrasiloxane (OMCTS), for example, is used broadly.

The polyalkylsiloxane compounds can be polymerized and are typically present in the production material as the pure substance or, typically in liquid form, as a mixture including other compounds They can be supplied in liquid form to the consuming unit, for example to a deposition burner. But usually, the liquid production material is transferred to a gaseous or vaporous phase by means of an evaporator and is supplied as a continuous gas flow to the consuming unit through a conduit system.

Based on these so-called chlorine-free starting materials, the prior art describes a number of methods for the production of synthetic quartz glass. Reference shall thus be made, for example, to the specifications, EP 0 760 373 A, WO 99/15468 A, WO 99/54259 A, WO 2013/092553 A, and EP 0 529 189 A.

Although prior methods recommend the use of purified starting materials, they are, in part, associated with a disadvantage in that the production is associated with the formation of a precipitate or gel in the evaporator and the vapor-conducting conduit system.

It is evident from the overall assessment of the prior art that the chlorine content, the metallic impurities content, and the residual moisture in the starting material, each individually, are of significance in the production of synthetic quartz glass in order to prevent the formation of a gel. However, none of the assessed documents illustrates that there might be a functional relationship between the individual impurities with regard to the formation of a gel. Moreover, the metallic impurities that are actually responsible for gel formation are not specified.

The issue of gel formation during the production of synthetic quartz glass based on polyalkylsiloxane is evident, for example, in processes on a large technical scale, for example, in processes with a production quantity exceeding 1 t, and leads to the vapor-conducting pipelines, mass flow regulators, chokes, and corresponding valves being coated and, in part, clogged by gels and residues. This impairs the control and flow behavior of the vapor-conducting overall system in uncontrollable manner. Accordingly, increasing gel formation makes it more difficult to control the flow of the polyalkylsiloxane vapor, which in turn has a negative impact on the reproducibility of the method (for example, batch variation of the soot density distribution) and the resulting product properties (for example, uniformity of axial/radial homogeneity of the soot density), for example, in multi-burner set-ups. Moreover, high costs arise due to the need for cleaning of the facilities used in the process, possible need for replacement thereof, and corresponding downtimes during cleaning. Increased costs due to losses of material also need to be taken into account.

An additional issue is evident in soot deposition methods, in which multiple consuming units need to be supplied with the production material concurrently, such as, for example, in soot deposition by means of multi-burner set-ups. In order to prevent non-uniform soot deposition and the formation of layers, it is particularly important in this context that each deposition burner has the same soot structure characteristics, both quantitatively and qualitatively. Fluctuations of the gas supply, for example due to depositions being formed due to gel formation, should be avoided.

The documents of the prior art assessed above and the methods described in these documents cannot fully solve these problems and there continues to be a need for further improved methods for the production of synthetic quartz glass.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 is a flow chart illustrating a method in accordance with one embodiment.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides a method for the production of synthetic quartz glass, in which the formation of side products, which, for example, lead to the formation of a precipitate in the vapor-conducting facilities for the production of synthetic quartz glass, is prevented.

Moreover, one embodiment provides a method for the production of synthetic quartz glass, in which multiple burners are concurrently supplied with a production material in a soot deposition method and in which a uniform distribution of the mass flows across a multitude of burners is ensured.

One embodiment provides a method for the production of synthetic quartz glass, in which batch variation of the soot density distribution is essentially prevented, and which leads to a soot, which is essentially uniform and includes an axial and/or radial homogeneity. Specifically in a method involving a multi-burner set-up, one embodiment enables the production of a density distribution in axial and/or radial direction that is uniform or is adjusted in specific manner. Accordingly, a relative density variation is attained in axial direction in the space between the end caps in a multi-burner set-up of less than 3%, in one embodiment less than 2%, each relative to the density of quartz glass, by means of one embodiment.

One method for the production of synthetic quartz glass, includes the following:

(a) evaporating a production material that contains at least one polymerisable polyalkylsiloxane compound while forming a production material vapor;
(b) supplying the production material vapor resulting from process step (a) to a reaction zone, in which the production material is converted to $SiO_2$ particles through pyrolysis or hydrolysis;
(c) depositing the $SiO_2$ particles resulting from processed step (b) on a deposition surface; and
(d) if applicable, drying and vitrifying the $SiO_2$ particles while forming synthetic quartz glass.

The method according to one embodiment is characterised in that, during the process, (1.) the at least one polyalkylsiloxane compound includes a chlorine content of up to 550 ppb and,
(2.) concurrently, the at least one polyalkylsiloxane compound includes a metallic impurities content of chromium (Cr) and zinc (Zn) of, added up, up to 25 ppb.

It has been evident, according to one embodiment, that compliance with both, that is, at the same time, the specified chlorine content and the metallic impurities content of Cr and Zn is what is important in order to prevent gel formation during the production of synthetic quartz glass based on a polyalkylsiloxane compound.

Accordingly, if the specifications of chlorine and metallic impurities Cr and Zn given above are met, there is no significant gel formation in the apparatus for the synthesis of synthetic quartz glass and a continuous operation during production can be maintained for a long period of time, for example, for a period of several months.

The method according to one embodiment is well-suited for the production of synthetic quartz glass through "direct vitrification." Since the temperatures during the deposition of the $SiO_2$ particles on the deposition surface are sufficiently high, this method is associated with direct vitrification of the $SiO_2$ particles. Accordingly, the "direct vitrification" forgoes the optional process step (d). In addition, the method according to one embodiment is also well-suited for the production of quartz glass according to the so-called "soot method," in which the temperature during the deposition of the $SiO_2$ particles in process step (c) is so low that a porous $SiO_2$ soot layer is obtained that is dried and vitrified to synthetic quartz glass in the separate process step (d).

Basically, any polyalkylsiloxane compound that is well-suited for the production of synthetic quartz glass can be used in the method according to one embodiment. In the scope of one embodiment, the term, polyalkylsiloxane, shall include both linear (also comprising branched structures) and cyclic molecular structures.

Particularly well-suited to cyclic representative molecules are polyalkylsiloxanes having the following general molecular formula:

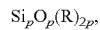

wherein p is an integral number larger than or equal to 2. The residue "R" is an alkyl group, that is, a methyl group in the simplest case.

Polyalkylsiloxanes are characterized by having a particularly high fraction of silicon per weight fraction, which contributes to the economic efficiency of their use in the production of synthetic quartz glass.

In one embodiment, the polyalkylsiloxane compound is preferably selected from the group consisting of hexamethylcyclotrisiloxane (D3), octamethylcyclotetrasiloxane (D4), decamethylcyclopentasiloxane (D5), dodecamethylcyclohexasiloxane (D6), tetradecamethylcycloheptasiloxane (D7), hexadecamethylcyclooctasiloxane (D8) and the linear homologues thereof. The D3, D4, D6, D7, and D8 terminology originates from a terminology introduced by General Electric Inc., in which "D" represents the [(CH3)2Si]-0-group.

Mixtures of the above-mentioned polyalkylsiloxane compounds can be used just as well in the scope of the present.

Due to the availability of commercial quantities at high purity, octamethylcyclotetrasiloxane (OMCTS) is currently used preferably. It is therefore particularly preferred in the scope of one embodiment if the polyalkylsiloxane compound is octamethylcyclotetrasiloxane (D4).

Multiple embodiments shall be presented in the following.

Chlorine Content:

In the scope of one embodiment, the chlorine content shall be understood to be the amount of chlorine resulting from the sum of all chlorine-containing inorganic and chlorine-containing organic components.

As mentioned above, at least one polyalkylsiloxane includes a chlorine content of up to 550 ppb.

As has also been mentioned above, commercially available OMCTS still contains traces of chlorine-containing components. The reason being that it is customary to use chlorine-containing silanes, such as dimethyldichlorosilanes, as starting products in the production of OMCTS. Even after the cyclisation process and common purification and/or distillation, traces of a residual chlorine content can be detected both in commercially available OMCTS and in the OMCTS that is used in the prior art assessed above. In this respect, the product feature of "halogen-free" and/or "chlorine-free" mentioned in the prior art must be understood to mean that the content of halogen and/or chlorine is below the detection limits existing at the respect points in time and/or the measurements of halogen content (and/or chlorine content) were conducted at most in the ppm range in the prior art.

It has been evident, according to one embodiment, that the pressure increase in the vapor-conducting system as a function of the amount evaporated in the production process is of an acceptable magnitude only if, inter alia, the residual chlorine content of the respective starting material complies with a certain specification that corresponds to the condition mentioned above.

In one embodiment, the at least one polyalkylsiloxane compound used in the further includes a chlorine content of up to 400 ppb, in one embodiment up to 250 ppb, in one embodiment up to 180 ppb, and in one embodiment up to 120 ppb.

For example, starting materials, which include a chlorine content of up to 180 ppb, illustrate a fully interference-free behavior in the method according to one embodiment with regard to the pressure increase in the system, and a continuous operation can be maintained for several months.

For reasons of production engineering, it is acceptable in the method according to one embodiment that the at least one polyalkylsiloxane compound includes a chlorine content of at least 40 ppb, for example, of at least 50 ppm, further, for example, of at least 60 ppb.

Therefore, the polyalkylsiloxane compound to be used in the method according to one embodiment includes a chlorine content of, in general, 40 to 550 ppb, for example, of 40 to 400 ppb, further, for example, 45 to 320 ppb, further, for example, of 50 to 250 ppb, further, for example, of 20 to 180 ppb, further, for example, of 60 to 120 ppb.

The chlorine content of the polyalkylsiloxane compound is determined by means of neutron activation analysis in the scope of one embodiment. Regarding the exact analytical conditions, reference shall be made to the further description in the exemplary embodiments.

In order to attain the content of chlorine in the polyalkylsiloxane compound used as production material, the polyalkylsiloxane compound is preferably subjected to a purification before use in the method according to one embodiment. The purification can be effected through any common methods for the purification of polyalkylsiloxane compounds, whereby the purification steps are repeated for as long as needed until the specifications of the polyalkylsiloxane compounds as provided by one embodiment are attained. Exemplary purification steps, to be applied repeatedly if applicable, include:

Contacting the polyalkylsiloxane compound to absorbent materials, for example activated charcoal and/or molecular sieves, and subsequent multi-stage distillation;

extraction of impurities from the polyalkylsiloxane compound; and

HPLC purification of the polyalkylsiloxane compound.

Corresponding procedures for the purification of polyalkylsiloxane compounds are described, for example, in GB 2459943 A, DE 103 59 951 A, EP 1 503 957 A, WO 2004/049398 A, EP 0 975 690 A, EP 0 760 373 A, and EP 0 105 328.

Content of Chromium and Zinc

Moreover, the starting material includes a metallic impurities content of Cr and Zn of, added up, up to 25 ppb.

It has been evident, according to one embodiment, that the presence of metallic impurities Cr and Zn is critical for gel formation during the production of synthetic quartz glass starting from polyalkylsiloxanes, especially if the chlorine content of the starting material is in the range is specified above. Possibly, the metallic impurities Cr and Zn, for example, accelerate gel formation in the residue and are therefore subject to more extensive restrictions then other metallic impurities with regard to the content of them that is present in the starting materials.

In this context, it is preferred in one embodiment that the at least one polyalkylsiloxane compound includes a content of Cr and Zn of up to 20 ppb, in one embodiment up to 12 ppb, in one embodiment up to 8 ppb, and in one embodiment up to 3 ppb.

For reasons of production engineering, it is acceptable in the method according to one embodiment that the at least one polyalkylsiloxane compound includes a Cr and Zn content of, in general, at least 1 ppb, for example at least 2 ppb.

Therefore, the polyalkylsiloxane compound to be used in the method according to one embodiment includes a Cr and Zn content of, in general, 1 to 25 ppb, for example, of 1 to 20 ppb, further, for example, of 2 to 12 ppb, further, for example, of 2 to 8 ppb.

In order to attain the content of metallic impurities in the polyalkylsiloxane compound used as production material, the polyalkylsiloxane compound is preferably subjected to a purification before use in the method according to one embodiment. The purification in one embodiment is preferably effected in the same manner as described above for the adjustment of the chlorine content of the at least one polyalkylsiloxane compound.

Embodiments of Chlorine Content and Cr and Zn Content:

In order to reduce gel formation in the method according to one embodiment, it is preferred, for example, in a first embodiment that the chlorine content of the starting material is up to 400 ppb and the metallic impurities content of Cr and Zn is up to 20 ppb.

The gel formation rate in the method according to one embodiment can be reduced even further in a second embodiment if the chlorine content of the starting material is up to 250 ppb and the Cr and Zn content is up to 12 ppb.

The gel formation rate in the method according to one embodiment can be reduced even further in a third embodiment if the chlorine content of the starting material is up to 180 ppb and the Cr and Zn content is up to 8 ppb.

The gel formation rate in the method according to one embodiment can be reduced even further in a fourth embodiment if the chlorine content of the starting material is up to 120 ppb and the Cr and Zn content is up to 3 ppb.

In the scope of the preceding first to fourth embodiment, it is feasible just as well that the at least one polyalkylsiloxane compound includes a Cr and Zn content of at least 2 ppb, in one embodiment at least 3 ppb, in one embodiment at least 4 ppb, and in one embodiment at least 5 ppb.

In the scope of the preceding first to fourth embodiment, it is feasible just as well that the at least one polyalkylsiloxane compound includes a chlorine content of at least 40 ppb, in one embodiment of at least 50 ppb, in one embodiment at least 100 ppb, and that the at least one polyalkylsiloxane compound includes a Cr and Zn content of at least 3 ppb, in one embodiment at least 5 ppb.

Residual Moisture Content:

Moreover, it has been evident according to one embodiment that the residual moisture content can also be significant for the prevention of gel formation during the synthesis of synthetic quartz glass based on an polyalkylsiloxane compound, whereby, according to one embodiment, the residual moisture content preferably is up to 150 ppm.

The residual moisture content of the starting material in the method according to one embodiment is clearly less critical than the above-mentioned conditions of the chlorine content and metallic impurities content of Cr and Zn, but it can still have an impact on the gel formation in the system and is therefore preferably adjusted in one embodiment to be within the range specified above.

The boiling point of water is markedly lower than that of the polyalkylsiloxane such that evaporation of the polyalkylsiloxane is associated with concurrent evaporation of the water and thus with a transfer of the water to the vapor phase. Due to the presence of moisture (water) and the interplay with the impurities specified above and the high evaporation temperatures of above 130° C., ring-opening reactions can commence that lead to increased gel formation during the evaporation, for example, in the presence of impurities that have an acidic or alkaline effect (Lewis base/acid).

Due to the presence of residual moisture in the starting material, the concurrent presence of chlorine-containing impurities, such as chlorosilanes, can lead to hydrolysis of these substances upon which free hydrochloric acid is formed. In turn, the free hydrochloric acid can lead to ring opening if cyclic polyalkylsiloxanes are used.

For example, it is preferred in one embodiment that the at least one polyalkylsiloxane compound includes a residual moisture content of up to 130 ppm, in one embodiment up to 110 ppm, in one embodiment up to 90 ppm, in one embodiment up to 70 ppm, in one embodiment up to 50 ppm, in one embodiment up to 30 ppm.

In the scope of one embodiment, it is acceptable that the at least one polyalkylsiloxane compound has a residual moisture content, in general, of at least 3 ppm, for example, at least 4 ppm, for example, at least 5 ppm.

Polyalkylsiloxanes are usually thermally stable and it can be expected, for example, that the cyclic OMCTS is not subject to ring opening in the presence of traces of water at temperatures between 140 and 210° C. and in the presence of catalysts, such as acids and bases. Accordingly, for example, no gel formation products are detectable after heating OMCTS that contains traces of water (for example, 180 ppm) in an ampoule for 24 hours. However, running the same experiment and heating the respective polyalkylsiloxane in the presence of impurities (for example, iron chloride), gel formation catalysed by the metal surfaces or the oxide layers formed on them is detectable.

Therefore, the residual moisture present in the starting material plays an essential role with respect to gel formation, in particular, when metallic impurities are present as well. In this context, the gel formation rate increases with increasing residual moisture content.

In order to attain the residual moisture content in the polyalkylsiloxane compound used as production material, the polyalkylsiloxane compound is preferably subjected to a purification before use in the method according to one embodiment. The purification is effected in the same manner as described above for the adjustment of the chlorine content of the at least one polyalkylsiloxane compound.

Content of Other Metallic Impurities:

Moreover, the starting material in one embodiment preferably includes a metallic impurities content of Cr and Zn of, added up, up to 500 ppb.

The metallic impurities other than Cr and Zn generally are metallic impurities selected from the group consisting of Li, Na, K, Mg, Ca, Fe, Cu, Cr, Mn, Ti, Al, Ni, Mo, W, V, Co, Zn, Pb, Ba, Sr, and Ag.

The metallic impurities can be present in elemental, in oxidic or in ionic form.

Moreover, it has been evident, according to one embodiment, that metallic impurities other than Cr and Zn being present in the starting material can also influence gel formation. The metallic impurities are accumulated to higher concentration during the evaporation of the starting material. Without wishing to be limited by theory, it is being presumed that metallic impurities accelerate gel formation by polymerization, which, in turn, leads to an elevated increase in system pressure. Therefore, in one embodiment the content of metallic impurities other than Cr and Zn is preferably also subject to certain limitations such that, preferably, no gel formation-promoting accumulation to increased concentration proceeds.

In this context of one embodiment, it is preferred that the at least one polyalkylsiloxane compound includes a content of metallic impurities other than Cr and Zn of up to 400 ppb, in one embodiment up to 300 ppb, in one embodiment up to 200 ppb, in one embodiment up to 100 ppb.

Moreover, it has been evident according to one embodiment that there is no need to use a starting material that is absolutely free of the metallic impurities. Minimum quantities of metallic impurities other than Cr and Zn that may be present in the at least one polyalkylsiloxane compound and are acceptable in terms of process engineering in one embodiment are at least 15 ppb, in one embodiment at least 20 ppb, in one embodiment at least 25 ppb, in one embodiment at least 30 ppb, in one embodiment at least 35 ppb, in one embodiment at least 40 ppb.

In the scope of one embodiment, it has been found, in particular, that metallic impurities selected from the group consisting of Li, Na, K, Mg, Ca, Cu, Cr, Mn, Ti, Al, Ni, Mo, W, V, Co, Zn, Pb, Ba, Sr, and Ag, promote gel formation in methods for the production of synthetic quartz glass.

In order to attain the content of metallic impurities in the polyalkylsiloxane compound used as production material, the polyalkylsiloxane compound is preferably subjected to a purification before use in the method according to one embodiment. The purification in one embodiment is preferably effected in the same manner as described above for the adjustment of the chlorine content of the at least one polyalkylsiloxane compound.

Adequate adjustment of the chlorine content and Cr and Zn content in the at least one polyalkylsiloxane compound allows stationary process conditions with no increase in system pressure to be realized in the apparatus for the production of synthetic quartz glass.

Moreover, using the present method, the density of the resulting soot can be made to have a relative density variation in axial direction in the intervening space of the end caps of less than 3%, in one embodiment of less than 2%. For production reasons, soot bodies have a certain layered structure, whereby the layers represent regions of local changes of the density or chemical composition. Soot bodies usually have a density of 25 to 32%, relative to the density of quartz glass. In this context, the soot bodies illustrate a relative variation in the density, which is reflected, during the vitrification of the soot body, in the quartz glass body, where it leads to radial, azimuthal, and axial variations of the hydroxyl groups or chlorine concentration, which, in turn, can lead to unfavorable properties of the quartz glass cylinder and quartz glass fibers produced therefrom. The density variation can be limited to the thresholds specified above through the use of the method according to one embodiment.

The method according to one embodiment is well-suited for the production of synthetic quartz glass through an external or internal deposition process.

If the method according to one embodiment for the production of synthetic quartz glass is performed as an external deposition process, this process in one embodiment preferably is an OVD process (outside vapor phase deposition), VAD process (vapor phase axial deposition) or a PECVD process (plasma enhanced chemical vapor deposition).

If the method according to one embodiment for the production of synthetic quartz glass is performed as an internal deposition process, this process preferably is inone embodiment an MCVD process (modified chemical vapor deposition).

Moreover, one embodiment relates to a polyalkylsiloxane compound that can be used in the method described above and in one embodiment preferably includes a chlorine content of up to 500 ppb and a metallic impurities content of Cr and Zn of up to 25 ppb.

Moreover, one embodiment includes polyalkylsiloxane compounds comprising a chlorine content of up to 400 ppb and a metallic impurities content of Cr and Zn of up to 16 ppb.

Moreover, one embodiment includes polyalkylsiloxane compounds comprising a chlorine content of up to 250 ppb and a metallic impurities content of Cr and Zn of up to 8 ppb.

Moreover, one embodiment includes polyalkylsiloxane compounds comprising a chlorine content of up to 180 ppb and a metallic impurities content of Cr and Zn of up to 3 ppb.

One embodiment also relates to the use of the polyalkylsiloxane compounds described above having the specifications as given in a method for the production of a synthetic quartz glass, for example, according to the method described above.

Additional embodiments shall be illustrated in more detail based on the following examples.

Experimental Procedure for the Production of Synthetic Quartz Glass

An evaporator according to DE 10 2013 209 673 was used to evaporate OMCTS and the increase of system pressure in the vapor-conducting conduit system was measured. The increase of system pressure as measured results from the change of the pressure in the evaporator and vapor-conducting conduit system that occurs with increasing amount of evaporated substance. It is a direct measure of the deposition of polymerized products in the evaporator system. The temperature in the vapor-conducting system is maintained to be constant at 180° C. during the experiment. Ideally, the temperature should be between 160 and 190° C. It is important that the temperature in the vapor-conducting system does not drop below the dew point in any place. The starting material is injected into the evaporation chamber along with an inert carrier gas. Nitrogen is used as the carrier gas.

1. Determination of Residual Moisture

The residual moisture of the polyalkylsiloxane compound was determined through Karl-Fischer titration, whereby either a volumetric or a coulometric procedure can be used. The assay is done using the TitroLine kF and/or TitroLine kF trace apparatus of SI Analytics following the standard procedure.

2. Determination of Metal Contents

The metallic impurities in the polyalkylsiloxane compound were determined by means of ICP-HS analysis. This includes pressure digestion of the polyalkylsiloxane in hydrofluoric acid (HF), evaporation of the hydrofluoric acid (HF) and of $H_2SiF_6$, topping up with distilled water, and measurement on the aqueous solution by ICP-MS (apparatus: Agilent 7500ce)

The calibration was done with standards, also in aqueous solution.

3. Determination of the Chlorine Content

The chlorine content was determined by means of neutron activation analysis at the Helmholtz Centre Berlin.

4. Results

The following results were obtained as a function of the chlorine content and the zinc and chromium content in the starting material:

++: no increase in system pressure (within >7 d);
+: very small increase in system pressure without impact on the method for the production of synthetic quartz glass (within 7 d);
o: small increase in system pressure, still acceptable in terms of process engineering (within 2 d);
−: large increase in system pressure, no longer acceptable in terms of process engineering (within 1 d);
−−: very large and increasing system pressure, in acceptable in terms of process engineering (within 6 hours).

| Example | Chlorine content [ppb] | σ Chlorine [ppb] | Sum Zn + Cr [ppb] | Performance regarding increase in system pressure per unit quantity |
|---|---|---|---|---|
| Exp. 1 | 50 | 10 | <3 | +++ |
| Exp. 2 | 50 | 10 | 21 | ++ |
| Exp. 3 | 50 | 10 | 25 | + |

-continued

| Example | Chlorine content [ppb] | σ Chlorine [ppb] | Sum Zn + Cr [ppb] | Performance regarding increase in system pressure per unit quantity |
|---|---|---|---|---|
| Exp. 4 | 180 | 30 | <3 | ++ |
| Exp. 5 | 180 | 30 | 16 | ++ |
| Exp. 6 | 180 | 30 | 24 | ○ |
| Exp. 7 | 180 | 30 | 32 | ○ |
| Exp. 8 | 180 | 30 | 45 | − |
| Exp. 9 | 410 | 55 | <3 | ++ |
| Exp. 10 | 410 | 55 | 34 | + |
| Exp. 11 | 520 | 70 | 3 | + |
| Exp. 12 | 520 | 70 | 26 | − |
| Exp. 13 | 850 | 100 | <3 | − |
| Exp. 14 | 850 | 100 | 30 | −− |

σ chlorine: Standard deviation

The examples demonstrate that concurrent compliance with an upper limit of chlorine in the starting compound of 550 ppb and an upper limit of chromium and zinc of 25 ppb is required in order to prevent gel formation in the apparatus for production of synthetic quartz glass (comparing example 11 to examples 8 and 13). Either the chlorine content or the content of chromium and zinc is outside of the inventive range in examples 8 and 13, whereas both the chlorine content and the content of chromium and zinc are within the inventive ranges in example 11.

Example 8 demonstrates that gel formation in the apparatus cannot be prevented despite an inventive chlorine content being present, if the content of chromium and zinc impurities is above the threshold according to one embodiment, whereas example 13 illustrates that gel formation in the apparatus cannot be prevented, if the content of chlorine impurity in the starting material is higher than the threshold, although the content of chromium and zinc impurities complies with the specification of one embodiment.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for the production of synthetic quartz glass, comprising:
   (a) evaporating a production material that contains at least one polymerisable polyalkylsiloxane compound while forming a production material vapor;
   (b) supplying the production material vapor resulting from (a) to a reaction zone, in which the production material is converted to $SiO_2$ particles through pyrolysis or hydrolysis;
   (c) depositing the $SiO_2$ particles resulting from (b) on a deposition surface; and
   (d) if applicable, drying and vitrifying the $SiO_2$ particles resulting from (c) while forming synthetic quartz glass;
   wherein the at least one polyalkylsiloxane compound comprises a chlorine content of up to 550 ppb and a metallic impurities content of chromium (Cr) and zinc (Zn) of, added up, up to 25 ppb; and
   wherein the at least one polyalkylsiloxane compound comprises a residual moisture content of up to 150 ppm.

2. The method of claim 1, wherein the at least one polyalkylsiloxane compound comprises a chlorine content of up to 400 ppb.

3. The method of claim 1, wherein the at least one polyalkylsiloxane compound comprises a chlorine content of at least 40 ppb.

4. The method of claim 1, wherein the at least one polyalkylsiloxane compound comprises a metallic impurities content of Zn and Cr of up to 16 ppb.

5. The method of claim 1, wherein the at least one polyalkylsiloxane compound comprises a metallic impurities content of Zn and Cr of at least 2 ppb.

6. The method of claim 1, wherein the at least one polyalkylsiloxane compound is subjected to a purification before using it as production material in order to adjust the chlorine content and the metallic impurities content of Cr and Zn to the range specified above.

7. The method of claim 1, wherein a multi-burner arrangement including 2 or more burners is used in (a) to (c).

8. A method for the production of synthetic quartz glass, comprising:
   (a) evaporating a production material that contains at least one polymerisable polyalkylsiloxane compound while forming a production material vapor;
   (b) supplying the production material vapor resulting from (a) to a reaction zone, in which the production material is converted to $SiO_2$ particles through pyrolysis or hydrolysis;
   (c) depositing the $SiO_2$ particles resulting from (b) on a deposition surface; and
   (d) if applicable, drying and vitrifying the $SiO_2$ particles resulting from (c) while forming synthetic quartz glass;
   wherein the at least one polyalkylsiloxane compound comprises a chlorine content of up to 550 ppb and a metallic impurities content of chromium (Cr) and zinc (Zn) of, added up, up to 25 ppb; and
   wherein the at least one polyalkylsiloxane compound comprises a metallic impurities content of Zn and Cr of at least 2 ppb.

9. The method of claim 8, wherein the at least one polyalkylsiloxane compound comprises a chlorine content of up to 400 ppb.

10. The method of claim 8, wherein the at least one polyalkylsiloxane compound comprises a chlorine content of at least 40 ppb.

11. The method of claim 8, wherein the at least one polyalkylsiloxane compound comprises a metallic impurities content of Zn and Cr of up to 16 ppb.

12. The method of claim 8, wherein the at least one polyalkylsiloxane compound comprises a residual moisture content of up to 150 ppm.

13. The method of claim 8, wherein the at least one polyalkylsiloxane compound comprises a residual moisture content of at least 3 ppm.

14. The method of claim 8, wherein the at least one polyalkylsiloxane compound is subjected to a purification before using it as production material in order to adjust the chlorine content and the metallic impurities content of Cr and Zn to the range specified above.

15. The method of claim 8, wherein a multi-burner arrangement including 2 or more burners is used in (a) to (c).

16. A method for the production of synthetic quartz glass, comprising:

(a) evaporating a production material that contains at least one polymerisable polyalkylsiloxane compound while forming a production material vapor;

(b) supplying the production material vapor resulting from (a) to a reaction zone, in which the production material is converted to $SiO_2$ particles through pyrolysis or hydrolysis;

(c) depositing the $SiO_2$ particles resulting from (b) on a deposition surface; and (d) if applicable, drying and vitrifying the $SiO_2$ particles resulting from (c) while forming synthetic quartz glass;

wherein the at least one polyalkylsiloxane compound comprises a chlorine content of up to 550 ppb and a metallic impurities content of chromium (Cr) and zinc (Zn) of, added up, up to 25 ppb; and wherein the at least one polyalkylsiloxane compound comprises a residual moisture content of at least 3 ppm.

17. The method of claim 16, wherein the at least one polyalkylsiloxane compound comprises a chlorine content of up to 400 ppb.

18. The method of claim 16, wherein the at least one polyalkylsiloxane compound comprises a chlorine content of at least 40 ppb.

19. The method of claim 16, wherein the at least one polyalkylsiloxane compound comprises a metallic impurities content of Zn and Cr of up to 16 ppb.

20. The method of claim 16, wherein the at least one polyalkylsiloxane compound comprises a residual moisture content of up to 150 ppm.

* * * * *